United States Patent
Ogino

(10) Patent No.: US 7,939,246 B2
(45) Date of Patent: May 10, 2011

(54) CHARGED PARTICLE BEAM PROJECTION METHOD

(75) Inventor: Kozo Ogino, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 994 days.

(21) Appl. No.: 11/452,239

(22) Filed: Jun. 14, 2006

(65) Prior Publication Data
US 2007/0196768 A1 Aug. 23, 2007

(30) Foreign Application Priority Data
Feb. 22, 2006 (JP) .................. 2006-045739

(51) Int. Cl.
*G03F 7/26* (2006.01)
(52) U.S. Cl. .............. 430/296; 430/30; 250/492.3
(58) Field of Classification Search .............. 430/30, 430/296; 250/492.2, 492.22, 492.3
See application file for complete search history.

(56) References Cited

U.S. PATENT DOCUMENTS 5,667,923 A * 9/1997 Kanata .............. 430/30
6,060,717 A * 5/2000 Manabe et al. ........ 250/492.22

FOREIGN PATENT DOCUMENTS

| JP | 2001-52999 A | 2/2001 |
| JP | 2002-313693 A | 10/2002 |
| JP | 2005-101501 A | 4/2005 |

OTHER PUBLICATIONS

F. Murai et al., "Fast proximity effect correction method using a pattern area density map", J.Vac. Sci. Technol. B, vol. 10, No. 6 (1992) p. 3072-3076.
S. A. Rishton et al., "Point exposure distribution measurements for proximity correction in electron beam lithographyon a sub-100 nm scale", J. Vac. Sci. Technol. B, vol. 5, No. 1 (1987) p. 135-141.
H. Kobinata et al., "Estimation of Optimum Electron Projection Lithography Mask Biases Taking Coulomb Beam Blur into Consideration", Jpn. J. Appl. Phys. vol. 42 (2003) p. 3816-3821.

* cited by examiner

*Primary Examiner* — Kathleen Duda
*Assistant Examiner* — Caleen O Sullivan
(74) *Attorney, Agent, or Firm* — Westerman, Hattori, Daniels & Adrian, LLP

(57) ABSTRACT

A deposition energy distribution when a charged particle beam is made incident upon a resist film, is approximated by a sum of element distributions having Gaussian distributions. A pattern area density map partitioning the pattern layout plane into small regions, is defined for each element distribution. First and second sub-steps are repeated for each of the pattern area density maps. In the first sub-step, an area density of each small region is obtained. In the second sub-step, in accordance with an energy deposition rate, an exposure dose assigned to a pattern in a first small region, an area of the pattern and the area density of the first small region, the deposition energy to be given to the target small region is obtained and the corrected area density is calculated. A deposition energy at an evaluation point on a pattern layout plane is calculated from the corrected area densities.

12 Claims, 12 Drawing Sheets

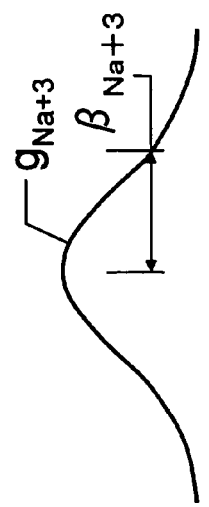
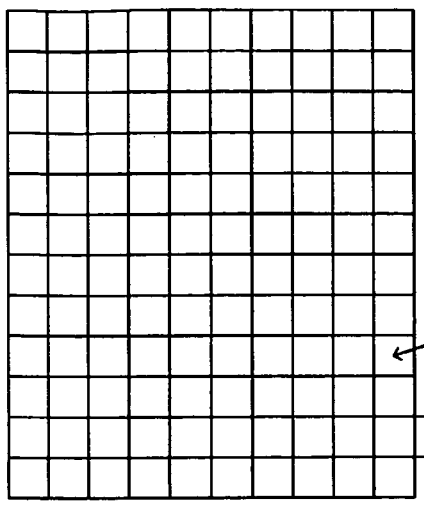
FIG. 5C
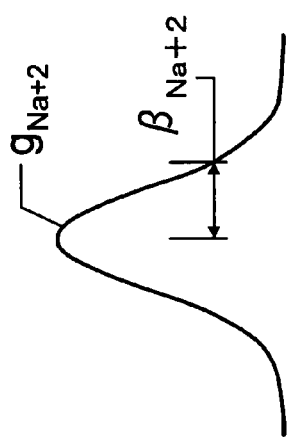
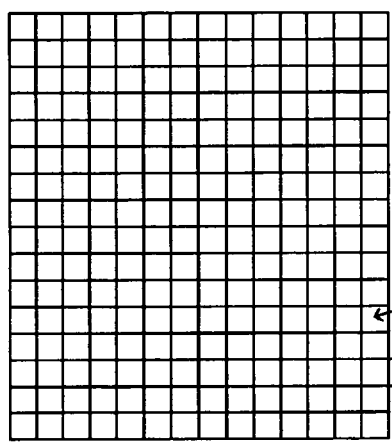
FIG. 5B
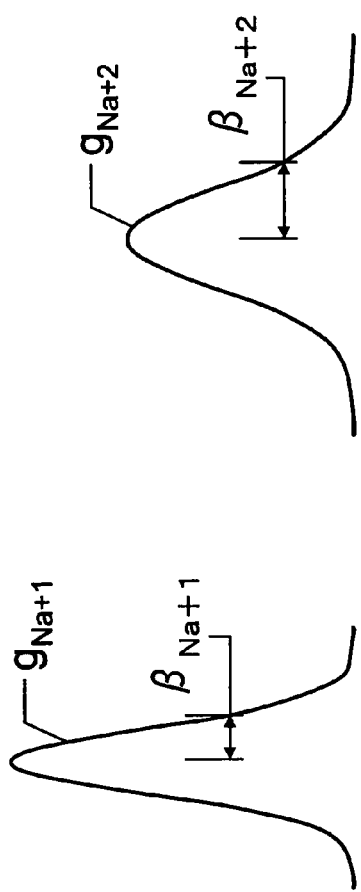
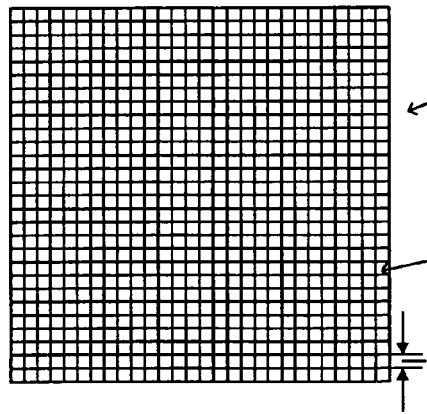
FIG. 5A

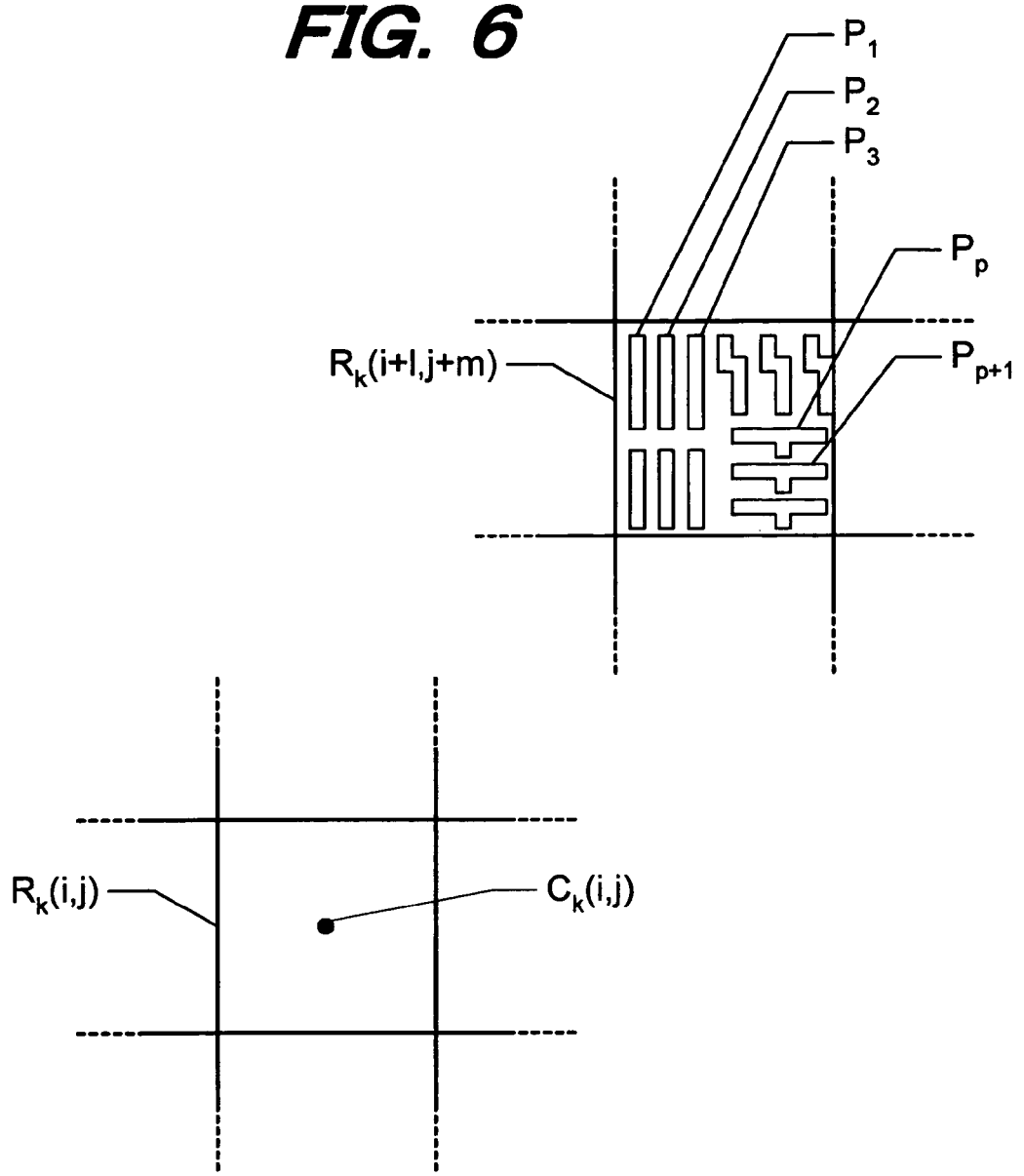

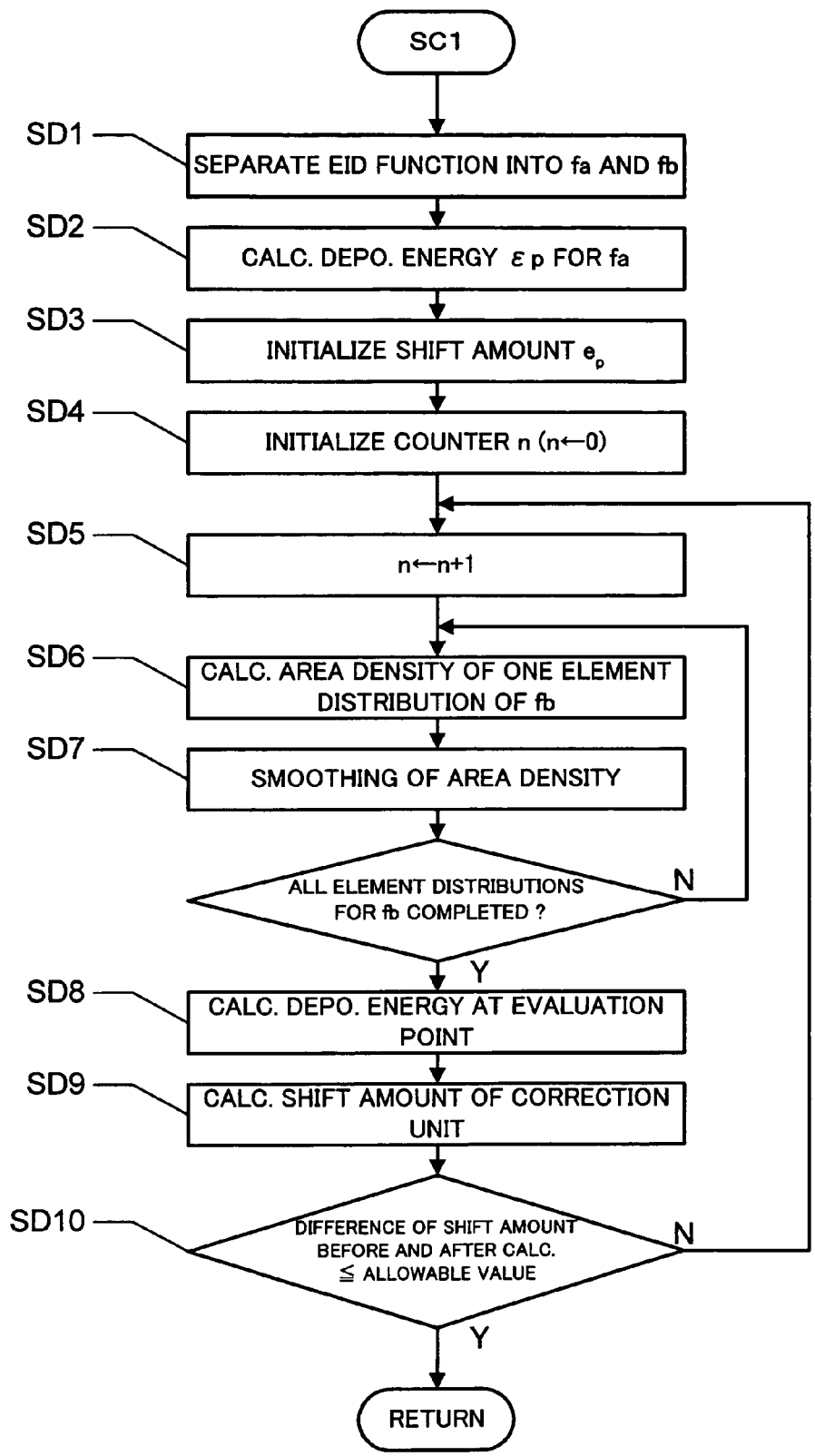

US 7,939,246 B2

CHARGED PARTICLE BEAM PROJECTION METHOD

CROSS REFERENCE TO RELATED APPLICATION

This application is based on and claims priority of Japanese Patent Applications No. 2006-045739 filed on Feb. 22, 2006, the entire contents of which are incorporated herein by reference.

BACKGROUND OF THE INVENTION

A) Field of the Invention

The present invention relates to a projection method using a charged particle beam, and more particularly to a projection method involving proximity effect correction for improving a precision of a pattern size after developing.

B) Description of the Related Art

Patterns to be formed are becoming finer because of recent improvements on an integration degree of semiconductor integrated circuit devices, and a resolution of a conventional optical projection is insufficient nowadays. In order to form a fine pattern, a projection using a charged particle beam, particularly an electron beam, is used.

An electron beam projection method is classified into a point beam projection, a variable shaped beam projection, a character projection and an electron projection lithography. With the point beam projection, an area to be exposed is scanned with an electron beam having a dot-shaped beam spot, and a high resolution can be obtained. On the other hand, it is difficult to obtain a high throughput. With the variable shaped beam projection, a pattern to be exposed is divided into small rectangular unit areas to perform exposure with respect to each unit area. As compared to the point beam projection, the variable shaped beam projection can effect a higher throughput.

With the character projection, a stencil mask having some repetitive patterns thereon is used and one-shot exposure is performed with respect to each pattern on the stencil. Similar to an optical projection, the electron projection lithography uses a mask corresponding to a pattern to be transferred to perform a one-shot exposure for a large area. As compared to the variable shaped beam projection, the character projection and electron projection lithography can reduce the number of electron beam shots, and can improve further a throughput.

While an electron beam is irradiated to a resist film on a substrate to print a circuit pattern, a portion of the electron beam incident upon the resist film is forward-scattered and a portion of the electron beam transmitted through the resist film is backscattered and becomes again incident upon the resist film. Therefore, even if an electron beam is made incident upon one point on the resist film, the effect of the electron beam incidence spreads and so-called proximity effect occurs.

An exposure intensity distribution function (hereinafter called an "EID function") for a resist film when an electron beam is made incident upon one point (x, y) on the resist film is expressed by the following equation in which a forward-scattering term and a backscattering term are approximated by Gaussian distributions:

$$f(x, y) = \frac{1}{\pi(1+\eta)}\left\{\frac{1}{\beta_f^2}\exp\left(-\frac{x^2+y^2}{\beta_f^2}\right) + \frac{\eta}{\beta_b^2}\exp\left(-\frac{x^2+y^2}{\beta_b^2}\right)\right\} \quad (1)$$

where $\beta_f$ represents a forward-scattering length, $\beta_b$ represents a backscattering length and $\eta$ represents a ratio of a backscattering energy to a forward-scattering energy (hereinafter called a backscattering ratio). The first term of the right side of the equation (1) is called a forward-scattering term and the second term is called a backscattering term. The forward-scattering has a large influence on a narrow area, whereas the backscattering has a small influence on a broad area. A ratio between these influences is the backscattering ratio $\eta$. These values are dependent upon an electron beam energy, a resist film thickness, a substrate material and the like, and are determined from exposure evaluation experiments or computer simulation. As an acceleration energy of an electron beam becomes high, the forward-scattering length $\beta_f$ becomes short and the backscattering length $\beta_b$ becomes long.

A conventional proximity effect correction method sets evaluation points at a center point and corners of each side of each pattern to be exposed, and calculates a deposition energy at each evaluation point when the pattern is exposed, by using the equation (1). A difference between a calculated value and a target value is calculated at each of a plurality of evaluation points, and an exposure dose is determined so as to minimize a square sum of the differences.

As the number of patterns increases greatly because of high integration of semiconductor integrated circuit devices, the above-described calculations take a long time. The proximity effect correction method has been desired which can shorten the calculation time and can set a size error of a developed pattern (finished pattern) in an allowable range.

As one example of the correction methods to meet the above requirements, "Fast proximity effect correction method using a pattern area density map" by F. Murai, et al., J. Vac. Sci. Technol. B, Vol. 10, No. 6 (1992), pp. 3072 to 3076 (Document 1) discloses a proximity effect correction method (hereinafter called a "pattern area density method") using a pattern area density map obtained by dividing a pattern layout plane into a plurality of rectangular small regions by a square lattice.

A spread of the forward-scattering is sufficiently smaller than a pattern pitch. Therefore, in order to obtain a deposition energy based on the forward-scattering term at an arbitrary point, it is only necessary to integrate the forward-scattering term of the equation (1) in an area of one pattern to be exposed. In this specification, an energy accumulated in a resist film is called a "deposition energy". The deposition energy is generally represented by the unit of "eV/cm³".

The backscattering influences a broader area than the forward-scattering. Therefore, the integration area of the backscattering term of the equation (1) is required to cover not only the target pattern but also a large number of nearby patterns. The calculation amount becomes therefore massive. In order to prevent an increase in the calculation amount, the deposition energy based on backscattered electrons is calculated by the pattern area density method. The pattern area density method will be described hereunder.

First, an exposure pattern layout plane is divided into a plurality of rectangular small regions by a square lattice having a fixed size. An area density of each small region is calculated. The term "area density" means a ratio of an area occupied by a pattern in the small region to the whole area of the small region. The size of the small region is set in such a manner that the deposition energy based on the backscattered electrons can be approximated generally constant in each of the small regions. The pattern area density map can therefore be obtained, having a correspondence between each small region and its area density.

Next, a deposition energy at the center point in a target small region is calculated, the deposition energy being generated by backscattering of electron beams incident upon the target small region and nearby small regions. This process is called "smoothing of the pattern area density map".

In the smoothing, it is assumed that a virtual electron beam having a uniform intensity is incident upon the whole area of each small region. An integrated value of the exposure dose of each small region by the virtual electron beam is equal to an integrated value of the exposure dose for the case where a pattern in the small region is exposed. Since it is assumed that the small region is uniformly exposed, the calculation amount can be reduced more than that of a numerical integration of the backscattering term of the equation (1).

It is therefore possible to calculate the deposition energy at the center point of each small region by the influence of backscattering. The deposition energy based on the backscattering at the center point of a small region is added to the deposition energy based on the forward-scattering in the pattern of the small region. A proper exposure dose of each small region can be calculated by considering the influences of forward-scattering and backscattering.

JP-A-2001-52999 discloses a method for correcting exposure dose using the pattern area density method to improve a pattern size precision after development. This method is applied to the variable shaped beam projection and character projection. JP-A-2002-313693 discloses a method for correcting the mask pattern size using the pattern area density method to improve a pattern size precision after development. This method is applied mainly to the electron projection lithography.

JP-A-2005-101501 discloses a method for calculating a deposition energy based on backscattering at high precision, by considering electron scattering in a plurality of layers under a resist film.

The EID function of the equation (1) does not reflect sufficiently the scattering effect in an actual structure constituted of a resist film to be exposed and a substrate. Therefore, as a pattern is made finer, the pattern size after development may shift from a target pattern size even if the exposure by the method disclosed in JP-A-2001-52999 or the method disclosed in JP-A-2002-313693 is performed.

An example of the EID function precisely reflecting the influence of electron scattering and the like occurring in an actual structure to be exposed is disclosed in "Point exposure distribution measurements for proximity correction in electron beam lithography on a sub-100 nm scale", S. A. Rishton et al., J. Vac. Sci. Technol. B, Vol. 5, No. 1 (1987), pp. 135 to 141 (document 2) and "Estimation of Optimum Electron Projection Lithography Mask Biases Taking Coulomb Beam Blur into Consideration", Jpn. J. Appl. Phys. Vol. 42 (2003), pp. 3816 to 3821 (Document 3). Document 2 discloses a method of approximating the EID function by a plurality of Gaussian distributions, and Document 3 discloses a method of approximating the EID function by Gaussian distributions and exponential distributions. These EID functions take into consideration not only the influence of patterns adjacent to the target pattern but also the influence of patterns remote from the target pattern.

SUMMARY OF THE INVENTION

The exposure dose correction method disclosed in JP-A-2001-52999 and the mask pattern size correction method disclosed in JP-A-2002-313693 cannot be applied to the EID functions disclosed in Document 2 and Document 3.

Conventionally, a deposition energy based on forward-scattering has been calculated by integrating the EID function only in a target pattern. Namely, a proper exposure dose is calculated under the condition that forward-scattering does not influence the deposition energy in adjacent patterns. However, as patterns are made finer and a pitch between patterns is made narrower, the influence by forward-scattering may extend to adjacent patterns.

An object of the present invention is to provide a charged particle beam projection method capable of forming at high precision a fine pattern whose influence by forward-scattering extends to adjacent patterns, and a computer program for executing the projection method.

According to one aspect of the present invention, there is provided a charged particle beam projection method comprising steps of:

(a) preparing pattern data for defining a plurality of patterns on a pattern layout plane;

(b) assigning each of the plurality of patterns with an exposure amount for exposing the pattern;

(c) approximating a deposition energy distribution when a charged particle beam is made incident upon a resist film, by a sum of a plurality of element distributions each represented by a Gaussian distribution;

(d) defining a pattern area density map partitioning the pattern layout plane into a plurality of small regions, for each of at least some element distributions among the plurality of element distributions;

(e) repeating sub-steps (e1) and (e2) for each of the pattern area density maps, (e1) obtaining an area density of each small region, the area density indicating a ratio of an area occupied by a pattern disposed in the small region, and (e2) in accordance with an energy deposition rate representative of an influence degree of exposure of a first small region upon a deposition energy to be given to a target small region, an exposure dose assigned to a pattern in the first small region, and an area of the pattern and the area density of the first small region, executing a sequence of obtaining the deposition energy to be given to the target small region, by using as the first region each of small regions influencing the target small region, calculating a corrected area density representative of the deposition energy to be given to the target small region by calculating a sum of deposition energies to be given to the target small region, and setting a correspondence between each of all small regions and the corrected area density; and (f) calculating the deposition energy at an evaluation point on the pattern layout plane, from the corrected area density calculated in the sub-step (e2).

By defining the pattern area density map for each element distribution, it becomes possible to set the small region divided in the pattern area density map to a size suitable for a spread of the element distribution. By defining a pattern area density map for each element distribution for forward-scattering, it becomes possible to take into consideration the influence of forward-scattering upon adjacent patterns and to perform a proper exposure.

BRIEF DESCRIPTION OF THE DRAWINGS

FIGS. 5A to 5C are charts showing an element distributions constituting an EID function and corresponding pattern area density maps.

FIG. 6 is a partial plan view illustrating a relation between a target small region and another small region.

FIG. 10 is a flow chart illustrating a proximity effect correction method adopted by the projection method of the second embodiment.

DESCRIPTION OF THE PREFERRED EMBODIMENTS

Figure 1:
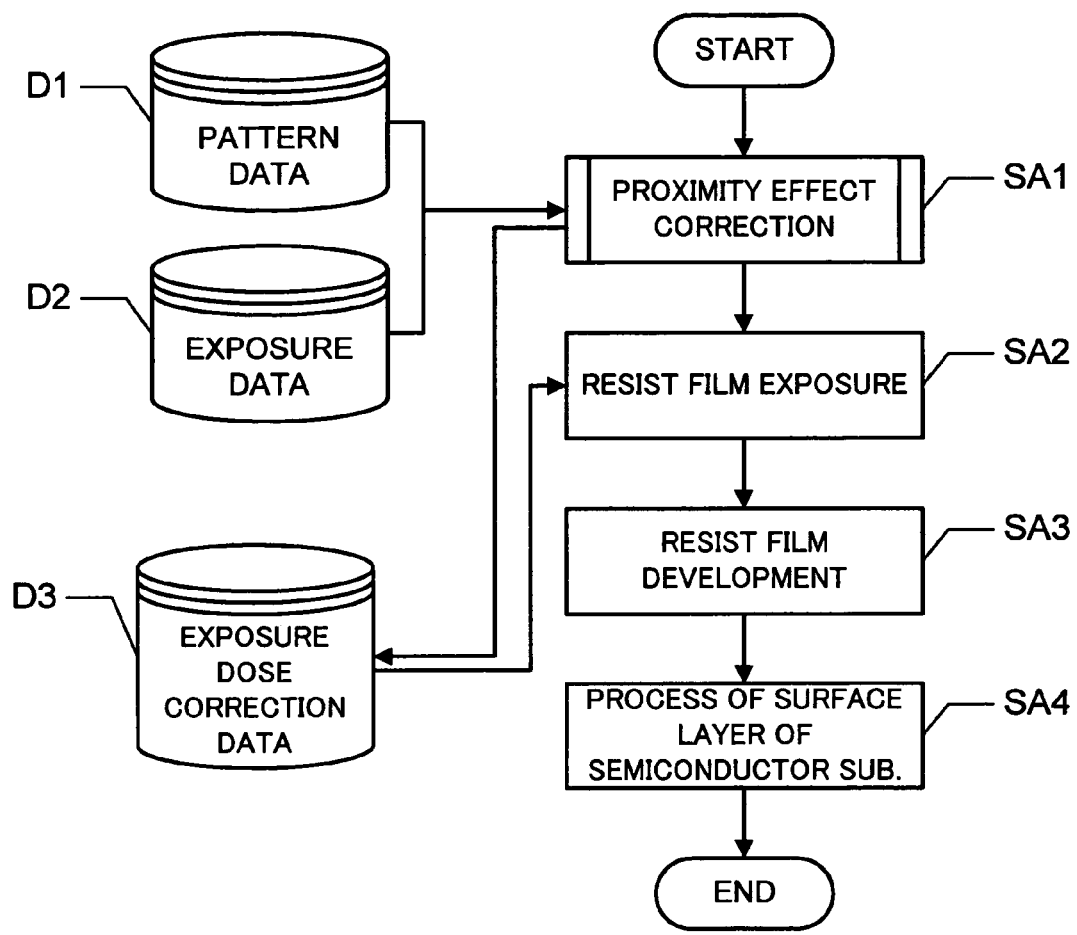
FIG. 1 is a flow chart illustrating a semiconductor device manufacture method using a projection method according to a first embodiment.

FIG. 1 is a flow chart illustrating a semiconductor device manufacture method using a projection method according to the first embodiment. Pattern data D1 defines the shape, size, position and the like of a plurality of patterns defined on a pattern layout plane. Exposure data D2 defines a relation between an exposure pattern unit to be exposed by one shot of an electron beam and an exposure dose for the exposure pattern unit. At Step SA1, proximity effect correction is performed by using the pattern data D1 and exposure data D2 to generate exposure dose correction data D3. The exposure dose correction data D3 includes a proper exposure dose assigned to each exposure pattern unit. At Step SA2, a resist film is exposed with an electron beam in accordance with the exposure correction data D3. At Step SA3, the exposed resist film is developed. At Step SA4, a surface layer of the semiconductor substrate is processed by using the developed resist film as a mask.

Figure 2:
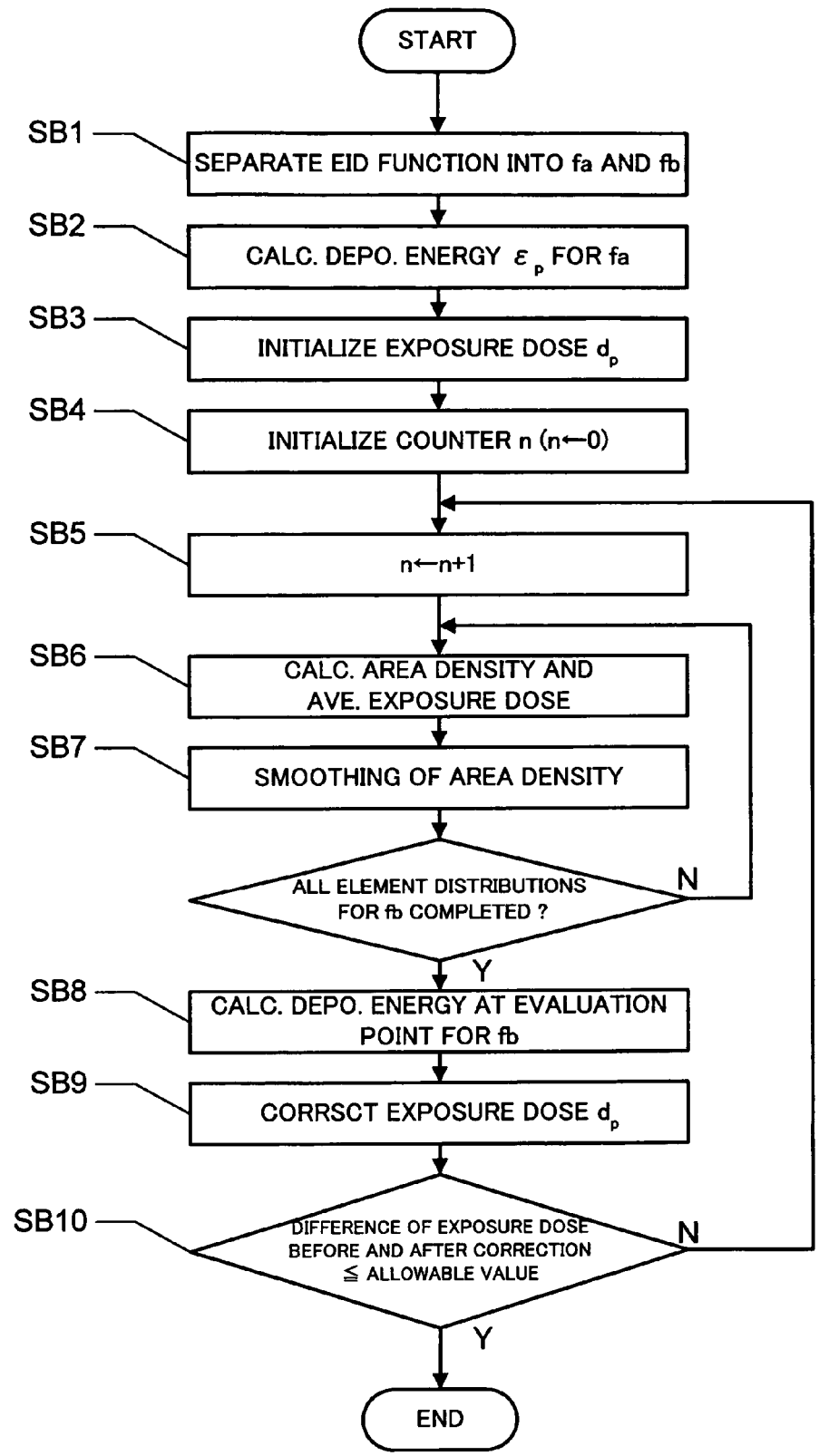
FIG. 2 is a flow chart illustrating a proximity effect correction method adopted by the projection method of the first embodiment.
Figure 3:
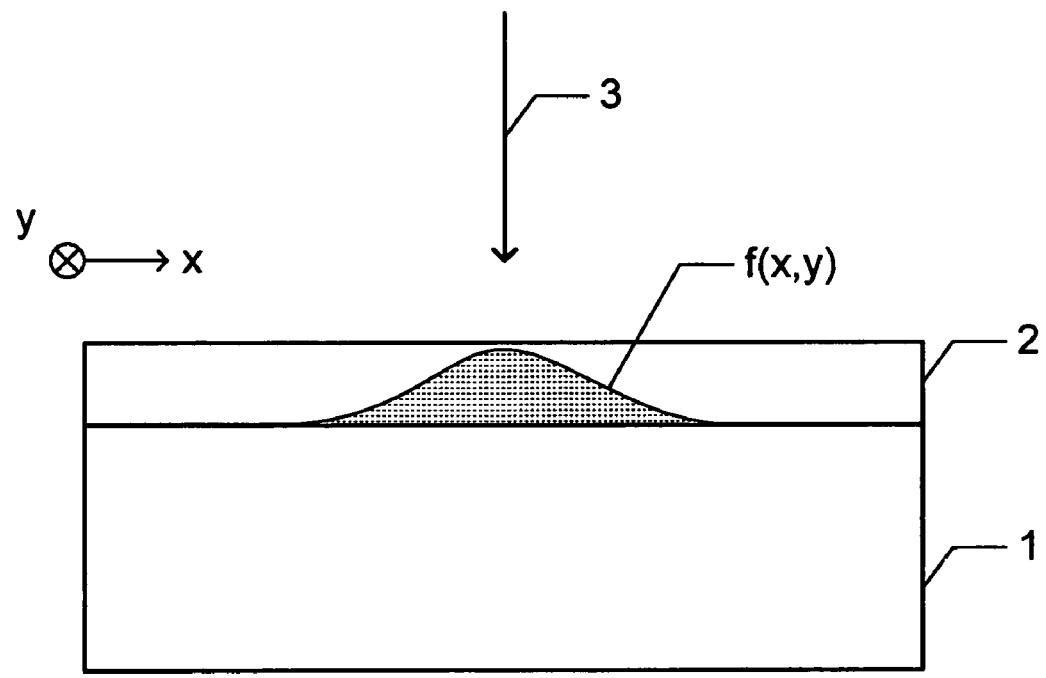
FIG. 3 is a chart showing an example of a substrate to be exposed and an EID function.

FIG. 2 is a flow chart illustrating the proximity effect correction process SA1 shown in FIG. 1, and FIG. 3 is a schematic cross sectional view of a substrate to be exposed.

As shown in FIG. 3, a resist film 2 is formed on the surface of a semiconductor substrate 1. An xy rectangular coordinate system is defined on the surface of the substrate 1. A plurality of patterns are defined on the surface (pattern layout plane) of the substrate 1, and the same patterns as these patterns are formed on the resist film. A pattern exposed by irradiation of one shot of an electron beam is called an "exposure pattern unit". First, an exposure intensity distribution function (EID function) f(x, y) of the resist film 2 when an electron beam 3 becomes incident upon one point on the resist film, is expressed by a sum of a plurality of element distributions $g_k(x, y)$ each represented by a Gaussian distribution. In each element distribution $g_k$, an area having a deposition energy of 1/e or larger of the deposition energy at the incidence point of the electron beam is called a "scattering range", and its radius is called a "scattering length".

The EID function f(x, y) and each element distribution $g_k(x, y)$ can be expressed by the following equations:

$$f(x, y) = \sum_k g_k(x, y) \tag{2}$$

$$g_k(x, y) = \frac{\eta_k}{\pi \beta_k^2} \exp\left(-\frac{x^2 + y^2}{\beta_k^2}\right)$$

where $\beta_k$ represents a scattering length. A symbol k identifying an element distribution is a serial number sequentially assigned to element distributions from the short scattering length side. Namely, $\beta_{k-1} < \beta_k$ is satisfied. $\eta_k$ represents a normalized intensity coefficient representative of an influence degree of each element distribution $g_k$ upon the EID function, and is expressed by:

$$\sum_k \eta_k = 1 \tag{3}$$

When one exposure pattern unit is exposed, the plurality of these element distributions $g_k$ are classified into components fa not influencing adjacent exposure patterns and components fb influencing the adjacent patterns. For example, an element distribution having a scattering length of a half of, or shorter than, the minimum space width defined by a design rule is classified into the "components fa not influencing adjacent patterns", and an element distribution having a scattering length longer than a half of the minimum space is classified into the "components fb influencing adjacent patterns".

At Step SB1 shown in FIG. 2, the EID function f(x,y) is expressed by a sum of the components fa(x, y) not influencing adjacent patterns and the components fb(x, y) influencing adjacent patterns. The EID function f(x, y), fa(x, y) and fb(x, y) are expressed by the following equations:

$$f(x, y) = fa(x, y) + fb(x, y) \tag{4}$$

$$fa(x, y) = \sum_{k=1}^{Na} g_k(x, y)$$

$$fb(x, y) = \sum_{k=1}^{Nb} g_{Na+k}(x, y)$$

where Na is the number of element distributions not influencing adjacent patterns, and Nb is the number of element distributions influencing adjacent patterns.

At Step SB2, for the components fa not influencing adjacent patterns, a deposition energy $\epsilon_p$ at a position on an outer peripheral line of a target pattern is obtained when an exposure pattern unit is exposed at a unit exposure dose. The "target pattern" means a pattern to be developed, corresponding to one exposure pattern unit. The deposition energy $\epsilon_p$ will be described hereunder. In this specification, the "deposition energy" represents an energy normalized by a standard exposure dose Qth, unless otherwise specifically defined. Namely, the "deposition energy" is a relative value to the standard exposure dose Qth, and an actual exposure energy can be obtained by multiplying the deposition energy by the standard exposure dose Qth. The standard exposure dose Qth may be defined as "an exposure dose capable of resolution as a target size when a standard isolate pattern, i.e., a pattern not influenced at all by the exposure of other patterns, is exposed". An actual exposure dose is usually expressed in the unit of "μC/cm$^2$".

Figure 4A:
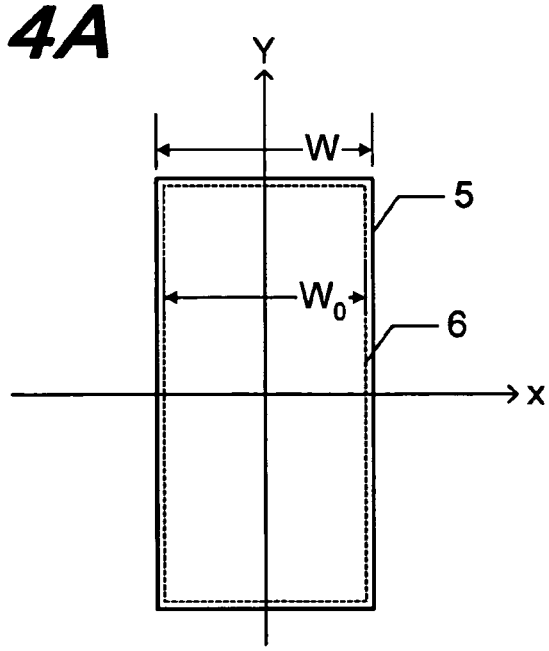
FIG. 4A is a plan view showing an exposure pattern unit and a target pattern after development.

FIG. 4A shows a plan view of an exposure pattern unit 5 and a target pattern 6. The exposure pattern unit 5 is a rectangle having a width W and being long in a y-axis direction, and the target pattern 6 is a rectangle having a width $W_0$ and being long in the y-axis direction. These patterns are assumed to be sufficiently long relative to the widths W and $W_0$.

Figure 4B:
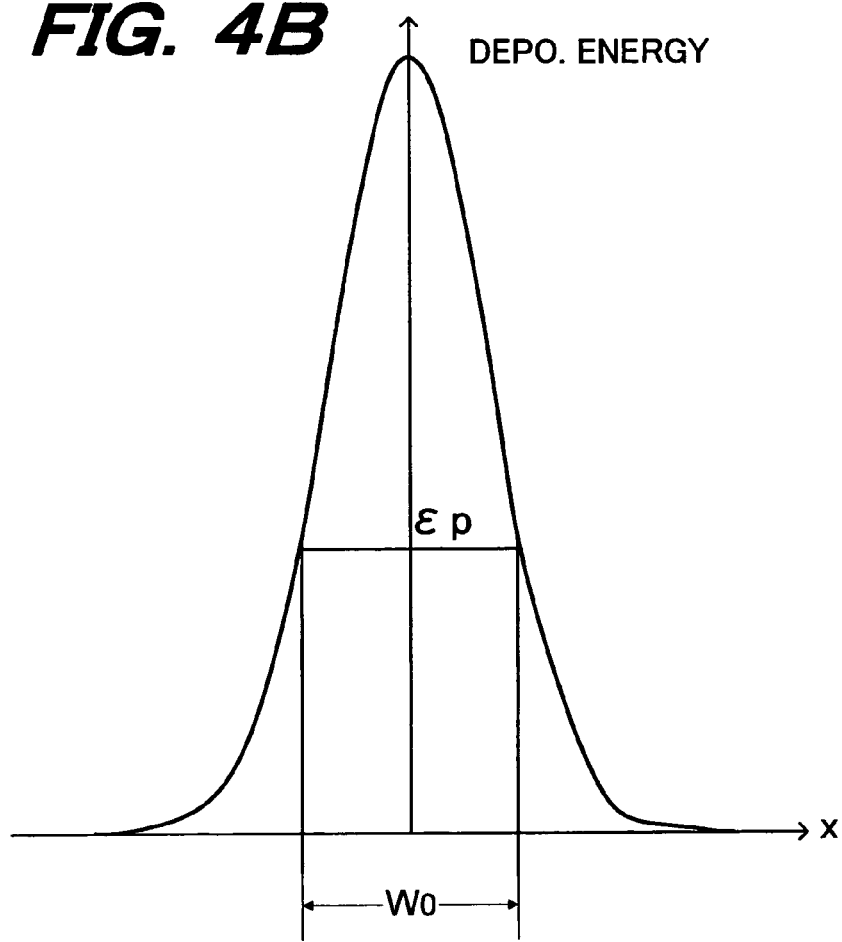
FIG. 4B is a graph showing a distribution of deposition energies based on forward-scattering when a unit pattern is exposed.

FIG. 4B shows a deposition energy distribution obtained by integrating the components fa(x, y) not influencing adjacent pattern in the area of the exposure pattern unit 5. Namely, the graph of FIG. 4B is given by the following equation:

$$\int_{-\infty}^{\infty} \int_{-w/2}^{w/2} fa(x, y) dx dy \tag{5}$$

A deposition energy $\epsilon_p(W)$ at the position on the outer peripheral line of the target pattern 6 when the exposure pattern unit 5 has the width W, i.e., at the position of $x=W_0/2$, is given by the following equation:

$$\varepsilon_p(W) = \sum_{k=1}^{Na} \frac{\eta_k}{2}\left[\mathrm{erf}\left(\frac{W - W_0}{2\beta_k}\right) + \mathrm{erf}\left(\frac{W + W_0}{2\beta_k}\right)\right] \tag{6}$$

Description will continue reverting to FIG. 2. At Step SB3, an exposure dose $d_p$ is initialized. Specifically, $d_p$ is set to 1. The exposure dose $d_p$ means an exposure dose assigned to a p-th exposure pattern unit $P_p$. with exposure pattern units being sequentially numbered from 1. In this specification, the "exposure dose" represents an exposure dose normalized by the standard exposure dose Qth, unless otherwise specifically defined. Namely, an actual exposure dose $Q_p$ is obtained by multiplying the exposure dose $d_p$ by the standard exposure dose Qth. An exposure dose $d_p$ of 1 means that all exposure pattern units $P_p$ are exposed at the standard exposure dose Qth.

At Step SB4, a counter n is initialized to 0. At Step SB5, the counter n is incremented by 1.

Steps SB6 and SB7 are executed for all element distributions $g_k$ (k=Na+1, Na+2, ...) of the components fb influencing adjacent patterns. At Steps SB6 and SB7, the element distribution $g_k$ at k=Na+n is processed (where n is a counter value set at Step SB5).

At Step SB6, a pattern area density map $DM_k$ corresponding to the element distribution $g_k$ is defined. In the following, the pattern area density map $DM_k$ will be described.

The pattern area density map $DM_k$ is defined on a pattern layout plane, the pattern area density map being constituted of a number of rectangular regions $R_k$ (hereinafter called "small regions") partitioned by a square lattice. One or more exposure pattern units $P_p$ are disposed in each small region $R_k$. A single exposure pattern unit $P_p$ may override a plurality of small regions $R_k$. A ratio of an area occupied by the exposure pattern unit $P_p$ in one small region $R_k$ to a whole area of the exposure pattern unit $P_p$ is called a "pattern area density" of the small region.

FIGS. 5A to 5C show a correspondence between each element distribution $g_k(x, y)$ and its pattern area density map $DM_k$. In upper parts in FIGS. 5A to 5C, shapes of the element distributions $g_{Na+1}$, $g_{Na+2}$ and $g_{Na+3}$ are shown. The element distribution $g_{Na+1}$ has the shortest scattering length $\beta_k$ among a plurality of element distributions $g_k$ constituting the components fb influencing adjacent patterns.

In FIGS. 5A to 5C, the pattern area density map $DM_k$ corresponding to the element distribution $g_k$ is shown in a lower part of an area where the element distribution $g_k$ is shown. A length (mesh size) $A_k$ of one side of the small region $R_k$ constituting the pattern area density map $DM_k$ is decided on the basis of the scattering length $\beta_k$ of the corresponding element distribution $g_k$. The mesh size $A_k$ is preferably set to less than half the scattering length $\beta_k$ of the corresponding element distribution $g_k$. For example, the mesh size is set in a range of $(1/20)\beta_k \leq A_k \leq (1/2)\beta_k$. The small region $R_{Na+1}$ of the pattern area density map $DM_{Na+1}$ corresponding to the element distribution $g_{Na+1}$ is called specifically a "standard small region".

After the pattern area density map $DM_k$ is defined, an area density $\alpha_k$ of each small region $R_k$ is calculated, and the area density $\alpha_k$ is correlated with the small region $R_k$.

Next, an average exposure dose $d_k$ is assigned to each small region $R_k$. The average exposure dose $d_k$ is an average of exposure doses $d_p$ weighted by an area of the exposure pattern unit $P_p$, the exposure dose $d_p$ being assigned to each of all exposure pattern units $P_p$ in each small region $R_k$.

The average exposure dose $d_k$ is defined by the following equation:

$$d_k = \frac{\sum_{p(R_k)} B_p d_p}{\sum_{p(R_k)} B_p} \tag{7}$$

where $B_p$ represents an area of the exposure pattern unit $P_p$, and Σ represents summing all exposure pattern units $P_p$ in each small region $R_k$. When the counter n reads 1, 1 is assigned to $d_p$ at Step SB3, when the counter n reads 2 or larger, a corrected exposure dose is assigned to $d_p$ at later Step SB9.

At Step SB7, smoothing of the area density is performed. A sequence of smoothing will be described with reference to FIG. 6.

FIG. 6 is a plan view showing a target small region $R_k(i, j)$ and another small region $R_k(i+l, j+m)$. A plurality of exposure pattern units $P_1, P_2, ...$ are disposed in the small region $R_k(i+l, j+m)$. A corrected area density $\alpha_{sk}(i, j)$ is defined by the following equation. "Smoothing of an area density" means calculating the following corrected area density:

$$\alpha_{sk}(i, j) = \frac{1}{d_k(i, j)} \sum_l \sum_m a_k(l, m)\alpha_k(i+l, j+m)d_k(i+l, j+m) \tag{8}$$

where $d_k(i+l, j+m)$ represents the average exposure dose $d_k$ defined by the equation (7) and assigned to the small region $R_k(i+l, j+m)$, and $a_k(l, m)$ represents a deposition energy at a center point $C_k(i, j)$ of the target small region $R_k(i, j)$ when the whole surface of the small region $R_k(i+l, j+m)$ is uniformly exposed at an exposure dose of 1 (i.e., actually the standard exposure dose Qth). In other words, $a_k(l, m)$ represents an influence degree of an deposition energy at which exposure to the small region $R_k(i+l, j+m)$ influences the target small region $R_k(i, j)$. This $a_k(l, m)$ is called an energy deposition rate. The energy deposition rate $a_k(l, m)$ is expressed by the following equation:

$$a_k(l, m) = \frac{1}{4}\left[\begin{array}{c}\mathrm{erf}\left(\frac{(l+1/2)A_k}{\beta_{Na+k}}\right)-\\ \mathrm{erf}\left(\frac{(l-1/2)A_k}{\beta_{Na+k}}\right)\end{array}\right]\times\left[\begin{array}{c}\mathrm{erf}\left(\frac{(m+1/2)A_k}{\beta_{Na+k}}\right)-\\ \mathrm{erf}\left(\frac{(m-1/2)A_k}{\beta_{Na+k}}\right)\end{array}\right] \quad (9)$$

The deposition energy $a_k$ depends upon a distance from the center point of the target small region $R_k(i, j)$, and does not depend on the position of the target small region $R_k(i,j)$. Therefore, the deposition energy $a_k$ is expressed by a function of variables l and m, i.e., a function of the distance from the small region $R_k(i+l, j+m)$ under exposure to the target small region $R_k(i, j)$, and this function does not contain variables i and j.

The term $a_k(l, m) \alpha_k(i+l, j+m)$ in the right side of the equation (8) means a deposition energy applied to the center point of the target small region $R_k(i, j)$ when the small region $R_k(i+l, j+m)$ is exposed uniformly at the exposure dose $\alpha_k(i+l, j+m)$. In the first embodiment, the deposition energy applied to the center point $C_k(i, j)$ of the target small region $R_k(i, j)$ when each exposure pattern unit $P_p$ in the small region $R_k(i+l, j+m)$ is exposed at the exposure dose of 1, is approximated by the deposition energy applied when the small region $R_k(i+l, j+m)$ is exposed at the uniform exposure dose $\alpha_k(i+l, j+m)$.

The term $a_k(l, m) \alpha_k(i+l, j+m) d_k(i+l, j+m)$ in the right side of the equation (8) is an approximate value of the deposition energy applied to the center point $C_k(i, j)$ of the target small region $R_k(i, j)$ when each exposure pattern unit $P_p$ in the small region $R_k(i+l, j+m)$ is exposed at the exposure dose $d_p$ assigned to the exposure pattern unit $P_p$.

The corrected pattern area density $\alpha_{sk}(i, j)$ in the equation (8) corresponds to the deposition energy at the center point of the target small region $R_k(i, j)$ normalized by the average exposure dose $d_k(i, j)$ assigned to the small region $R_k(i, j)$. Namely, the corrected pattern area density $\alpha_{sk}(i, j)$ means the deposition energy applied to the center point of the target small region $R_k(i, j)$ when the unit exposure dose is assigned to the exposure pattern unit $P_p$ in the target small region $R_k(i, j)$.

At Step SB7, the corrected area densities $\alpha_{sk}(i, j)$ is assigned to all small regions $R_k(i,j)$ of the pattern area density map $DM_k$ corresponding to one element distribution $g_k$.

Steps SB6 and SB7 are executed for all element distributions $g_k$ constituting the components fb influencing adjacent patterns, so that the corrected area density $\alpha_{sk}(i, j)$ can be assigned to each of the small regions $R_k(i,j)$ of all pattern area density maps $DM_k$.

In the following, description will be made on first and second methods of deciding the mesh size $A_k$ of the pattern area density map $DM_k$ corresponding to each element distribution $g_k$.

In the first method, first, a mesh size $A_{Na+1}$ of the pattern area density map $DM_{Na+1}$ corresponding to the element distribution $g_{Na+1}$ having the shortest scattering length $\beta_k$ is decided. As described above, the mesh size $A_{Na+1}$ is set to less than half the scattering length $\beta_{Na+1}$. A mesh size $A_k$ of the pattern area density map $DM_k$ corresponding to other element distributions $g_k$ having a scattering length longer than the scattering length $\beta_{Na+1}$ is set to less than half the scattering length $\beta_k$ of the element distribution $g_k$, and in addition the standard small region $R_{Na+1}$ is disposed so as not to override a border line of the small region $R_k$ of the pattern area density map $DM_k$ corresponding to the element distribution $g_k$ having a longer scattering length $\beta_k$. In order to allow this layout, the mesh size $A_k$ is an integral multiple of the mesh size $A_{Na+1}$.

As the standard small region $R_{Na+1}$ is disposed so as not to override a border line of the small region $R_k$ of the pattern area density map $DM_k$, it becomes easy to calculate the area density $\alpha_k(i, j)$ of the pattern area density map $DM_k$ ($k \geq Na+2$). For example, if a mesh size $A_k$ of the pattern area density map $DM_k$ is $n_k$ times the mesh size $A_{Na+1}$, the area density $\alpha_k(i, j)$ can be obtained from the following equation:

$$\alpha_k(i, j) = \frac{1}{n_k^2}\sum_{l=0}^{n_k-1}\sum_{m=0}^{n_k-1}\alpha_{Na+1}(n_k i + l, n_k j + m) \quad (10)$$

In the second method, the mesh size $A_k$ is set in such a manner that a ratio between the scattering length $\beta_k$ and mesh size $A_k$ becomes constant for all pattern area density maps $DM_k$. In this case, approximation precisions of the deposition energy in each pattern area density map $DM_k$ can be approximately uniformed. However, the equation (10) cannot be applied and it is necessary that the area density $\alpha_k(i, j)$ is calculated for each pattern area density map $DM_k$ by using pattern data of the exposure pattern unit.

The equation (10) can be considered that the standard small region $R_{Na+1}$ is regarded as a virtual exposure pattern unit having an area weighted by the area density of the standard small region $R_{Na+1}$ and that the area density is calculated on the assumption that the virtual exposure pattern unit is disposed in the small region $R_k$. According to the second method, although the equation (10) cannot be applied directly in this form, the area density of the small region $R_k$ can be calculated easily by regarding the standard small region $R_{Na+1}$ as the virtual exposure pattern unit having an area weighted by the area density of the standard small region $R_{Na+1}$.

Description will continue reverting to FIG. 2. At Step SB8, a deposition energy at the evaluation point is calculated for the components fb influencing adjacent patterns. In the following, description will be made on a method of calculating a deposition energy at an evaluation point. In the first embodiment, a center point of each standard small region $R_{Na+1}(i, j)$ is used as an evaluation point $V(x, y)$.

The deposition energy at a center point of the pattern area density map $DM_{Na+1}$ normalized by the exposure dose assigned to the standard small region $R_k$ is already obtained by the equation (8). Namely, the deposition energy at the evaluation point $V(x,y)$ is already obtained. The deposition energy $\alpha_{sk}(x, y)$ at the evaluation point $V(x,y)$ is equal to the corrected area density $\alpha_{sk}(i, j)$ of the standard small region $R_k(i, j)$ containing the evaluation point.

Figure 7:
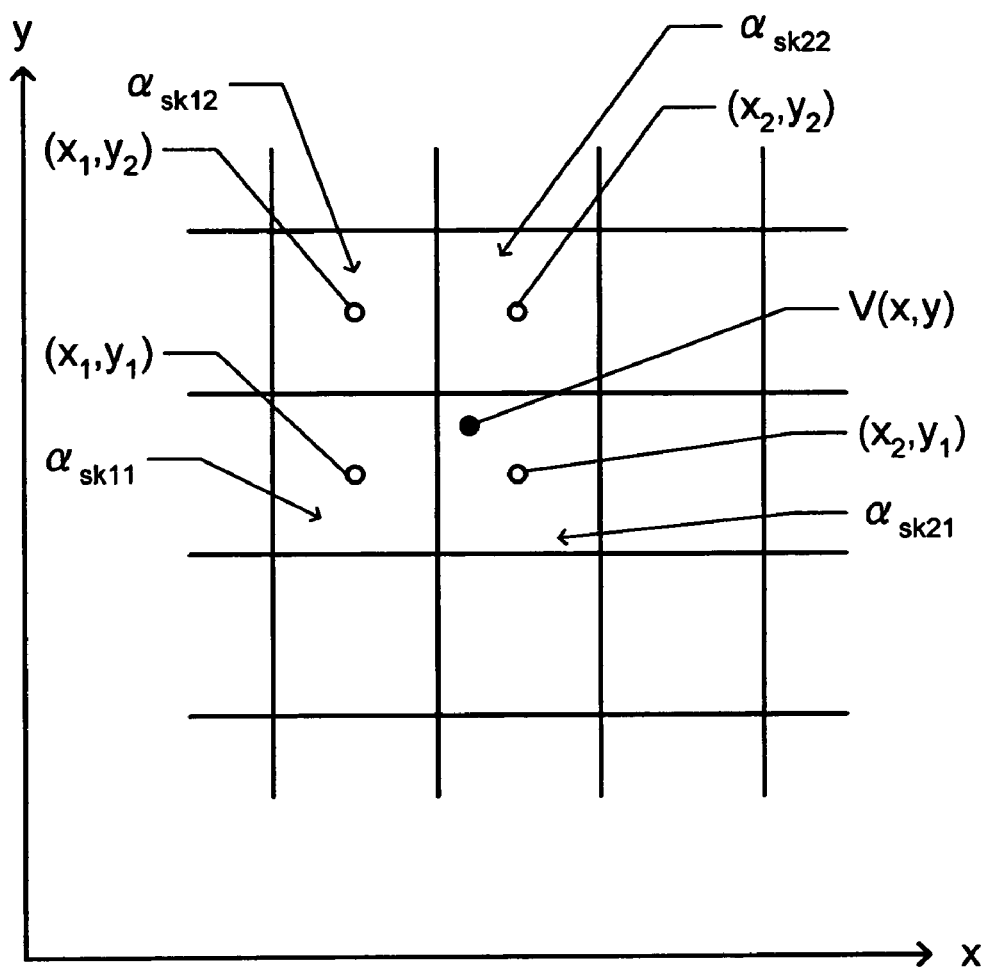
FIG. 7 is a plan view illustrating a relation between an evaluation point and center points of small regions surrounding the evaluation point.

The evaluation point $V(x, y)$ is not necessarily coincident with the center point of the small region $R_k$ of the pattern area density map $DM_k$ corresponding to the element distribution $g_k$ having a longer scattering length $\beta_k$. With reference to FIG. 7, description will be made on a method of calculating a deposition energy at the evaluation point $V(x, y)$ which depends on the element distribution $g_k$ having the longer scattering length $\beta_k$.

FIG. 7 shows a portion of the pattern area density map $DM_k$ ($k \geq Na+2$). The evaluation point $V(x, y)$ is not necessarily coincident with the center point of the small region $R_k$. A plurality of center points, e.g., four center points, of the small region $R_k$ are selected in the order of shorter distance from the evaluation point $V(x, y)$. For example, four center points $(x_1, y_1)$, $(x_1, y_2)$, $(x_2, y_1)$ and $(x_2, y_2)$ are selected. The corrected area densities assigned to the small regions $R_k$ containing these four center points are represented by $\alpha_{sk11}$, $\alpha_{sk12}$, $\alpha_{sk21}$ and $\alpha_{sk22}$. The deposition energy $\alpha_{sk}(x, y)$ at the evaluation point $V(x, y)$ is obtained by interpolating the corrected area densities $\alpha_{sk}(i, j)$ assigned to the small regions $R_k$ containing the four center points. Specifically, the deposition energy $\alpha_{sk}(x, y)$ at the evaluation point $V(x, y)$ can be calculated from the following equation:

$$\alpha_{sk}(x, y) = \frac{(x_2 - x)(y_2 - y)}{(x_2 - x_1)(y_2 - y_1)}\alpha_{sk11} + \frac{(x_2 - x)(y_1 - y)}{(x_2 - x_1)(y_2 - y_1)}\alpha_{sk12} + \frac{(x_1 - x)(y_2 - y)}{(x_2 - x_1)(y_2 - y_1)}\alpha_{sk21} + \frac{(x_1 - x)(y_1 - y)}{(x_2 - x_1)(y_2 - y_1)}\alpha_{sk22} \quad (11)$$

The deposition energy $\alpha_s\eta(x, y)$ at the evaluation point $V(x, y)$ is given by the following equation, by considering all element distributions for the components fb influencing adjacent patterns:

$$\alpha_s\eta(x, y) = \sum_{k=1}^{Nb} \alpha_{sk}(x, y)\eta_{Na+k} \quad (12)$$

At Step SB9, the exposure dose $d_p$ assigned to each exposure pattern unit is corrected. The correction method will be described hereunder.

As indicated by the equation (6), considering only the components fa not influencing adjacent patterns, if the unit exposure dose is assigned to the target standard small region $R_{Na+1}(i, j)$, the deposition energy is $\epsilon_p(W)$ at the position on the outer peripheral line of the target pattern 6 (refer to FIG. 4A) in the target standard small region $R_{Na+1}(i, j)$. Considering only the components fb influencing adjacent patterns, if the unit exposure dose is assigned to the target standard small region $R_{Na+1}(i, j)$, the deposition energy at the evaluation point $V(x, y)$ is the deposition energy $\alpha_s\eta(x, y)$ given by the equation (12). The deposition energy $\alpha_s\eta(x, y)$ based on the components fb influencing adjacent patterns can be approximated to be generally uniform in the standard small region $R_{Na+1}(i, j)$. Therefore, the deposition energy at the position on the outer peripheral line of the target pattern 6 is a sum of $\epsilon_p(W)$ and $\alpha_s\eta(x, y)$.

If the deposition energy on the outer peripheral line of the target pattern 6 is equal to the threshold value (resolution threshold value) of the deposition energy for developing a resist film, a width of the target resolution pattern 6 can be set to the target value $W_0$. In order to satisfy this condition, the exposure dose $d_p$ presently assigned to each exposure pattern unit $P_p$ in the standard small region $R_{Na+1}(i, j)$ containing the exposure pattern unit 5 is corrected, and a newly corrected exposure dose $d_p$ is assigned. This numerical expression is given in the following equation:

$$\{\varepsilon_p(W) + \alpha_s\eta(x, y)\}d_p = F_{th} \quad (13)$$

$$F_{th} = \frac{E_{th}}{Q_{th}}$$

where $d_p$ represents an exposure dose after correction, $E_{th}$ represents an actual resolution threshold value of a resist film, and $F_{th}$ represents an actual resolution threshold value normalized by the standard exposure dose $Q_{th}$.

The exposure dose $d_p$ after correction can be obtained from the equation (13). The newly obtained exposure dose $d_p$ is assigned to the exposure pattern unit 5.

At Step SB10, a difference between the exposure dose $d_p$ before correction and the exposure dose $d_p$ after correction is calculated for all exposure pattern units $P_p$. It is judged whether the maximum value of these differences is equal to, or smaller than, a preset allowable value. If equal or smaller, the process is terminated, and the exposure dose $d_p$ after correction is used as a proper exposure dose for exposing the exposure pattern unit $P_p$. If the maximum value of differences is larger than the allowable value, the process starting from Step SB5 is executed again by using the exposure dose $d_p$ after correction.

Although it is assumed that the exposure pattern unit 5 shown in FIG. 4A is contained in the standard small region $R_{Na+1}$ at Step SB9, one exposure pattern unit $P_p$ may override a plurality of standard small regions $R_{Na+1}$ in the case of a long pattern or a character projection pattern. Next, with reference to FIG. 8, description will be made on a method of calculating the exposure dose $d_p$ if one exposure pattern unit $P_p$ overrides a plurality of standard small regions $R_{Na+1}$.

Figure 8:
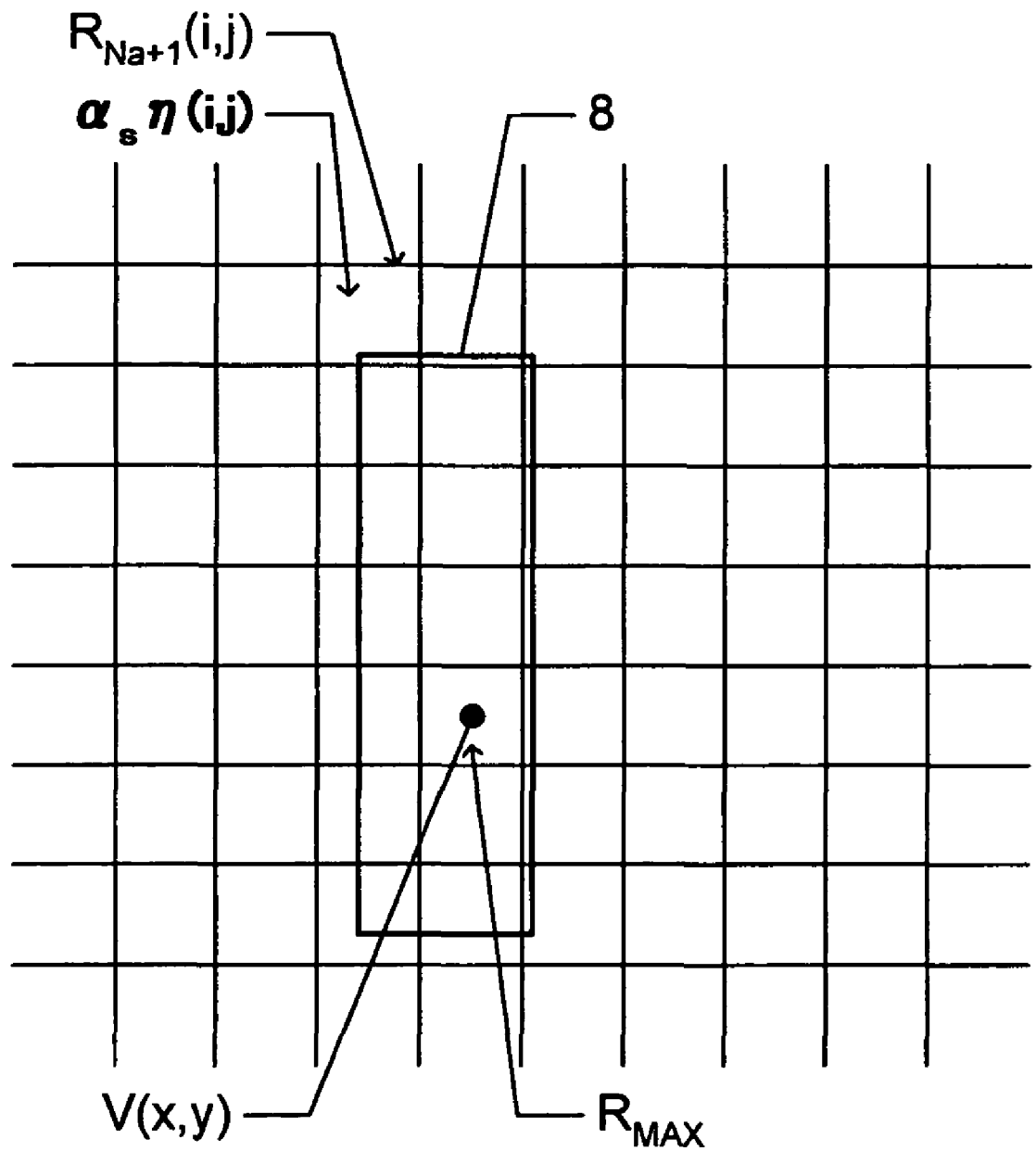
FIG. 8 is a plan view showing an example of one exposure pattern unit disposed overriding a plurality of small regions.

As shown in FIG. 8, an exposure pattern unit 8 is superposed upon a plurality of standard small regions $R_{Na+1}$, e.g., twenty first standard small regions $R_{Na+1}$ of seven rows and three columns. The corrected area density $\alpha_s\eta(i, j)$ assigned to each of twenty first standard small regions $R_{Na+1}$ is compared, and the center point of the standard small region $R_{MAX}$ having a maximum corrected area density $\alpha_s\eta(i, j)$ is used as the evaluation point $V(x, y)$. The deposition energy $\alpha_s\eta(x, y)$ at the evaluation point is substituted in the equation (13) to calculate a corrected exposure dose $d_p$.

If the corrected exposure dose $d_p$ is assigned to the exposure pattern unit 8 according to this method, an exposure dose becomes insufficient in the standard small region other than the standard small region $R_{MAX}$ having the maximum deposition energy $\alpha_s\eta(x, y)$. In order to compensate for this insufficient exposure dose, supplemental exposure is performed for all standard small regions $R_{Na+1}(i,j)$ other than the standard small region $R_{MAX}$. An exposure dose for supplemental exposure is expressed by the following equation:

$$d_{aux}(i, j) = \frac{\{\alpha_s\eta_{MAX} - \alpha_s\eta(i, j)\}d_p}{\sum_{k=1}^{Na}\eta_k} \quad (14)$$

where $\alpha_s\eta_{MAX}$ represents a deposition energy at the center point of the standard small region $R_{MAX}$ dependent upon the components fb, $\alpha_s\eta(i, j)$ represents a deposition energy at the center point of the standard small region $R_{Na+1}(i, j)$ dependent upon the components fb, and $d_p$ represents a proper exposure dose for the exposure pattern unit 8.

Since an exposure dose small enough to compensate for an insufficient exposure dose is used for supplemental exposure, an increase in the deposition energy at the center of the standard small region $R_{Na+1}(i, j)$ by supplemental exposure can be approximated by a value (a numerator of the right side of the equation (14)) obtained by multiplying a result (a denominator of the right side of the equation (14)) of surface integral, in a sufficiently broad area, of the components fa(x, y) not influencing adjacent patterns, by a supplemental exposure dose $d_{aux}(i, j)$. If the supplemental exposure dose $d_{aux}(i, j)$ is very small, supplemental exposure may not be performed.

In the above-described first embodiment, the EID function is separated at Step SB1 into the components fa not influencing adjacent patterns and the components fb influencing adjacent patterns. If even forward-scattering components influence adjacent patterns, these components may be classified into the components fb so that a precision of an obtained proper exposure dose can be improved. Further, a correspondence is set between the element distribution $g_k$ (k=Na+1, Na+2, ...) of the component fb influencing adjacent patterns, and the pattern area density map having the mesh size dependent upon the scattering length $\beta_k$. It is therefore possible to secure a sufficient approximation precision and prevent an increase in a calculation time to be caused by using an unnecessarily fine pattern area density map.

By exposing each exposure pattern unit at an exposure dose calculated by the method of the first embodiment, the shape and size of a pattern after development can be brought close to the target shape and size.

Figure 9:
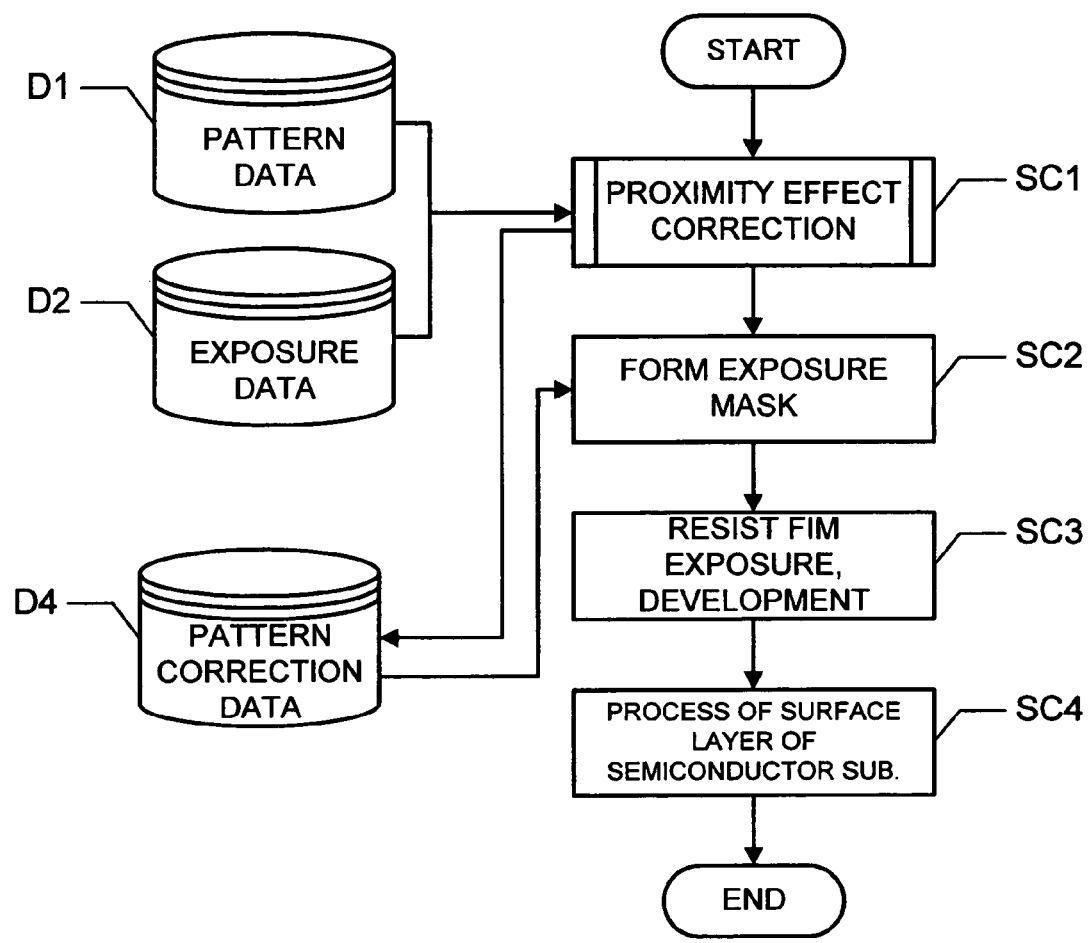
FIG. 9 is a flow chart illustrating a semiconductor device manufacture method using a projection method according to a second embodiment.

FIG. 9 is a flow chart illustrating a semiconductor device manufacture method according to the second embodiment. At Step SC1, a proximity effect correction is conducted by referring to pattern data D1 and exposure data D2 to generate pattern correction data D4. The pattern correction data D4 contains a shift amount of a side of a pattern assigned to each correction unit constituting an exposure pattern. At Step SC2, an exposure mask is formed in accordance with the pattern correction data D4. At Step SC3, a resist film is exposed with an electron beam and developed, by using the formed exposure mask. At Step SC4, a surface layer of the semiconductor substrate is processed by using the developed resist film.

FIG. 10 is a flow chart illustrating the proximity effect correction process SC1 shown in FIG. 9. In the first embodiment, a proper exposure dose is obtained for each exposure pattern unit, whereas in the second embodiment, the same exposure dose is set to all exposure pattern units, and the shape of an exposure pattern is changed instead of correcting the exposure dose.

Figure 11A:
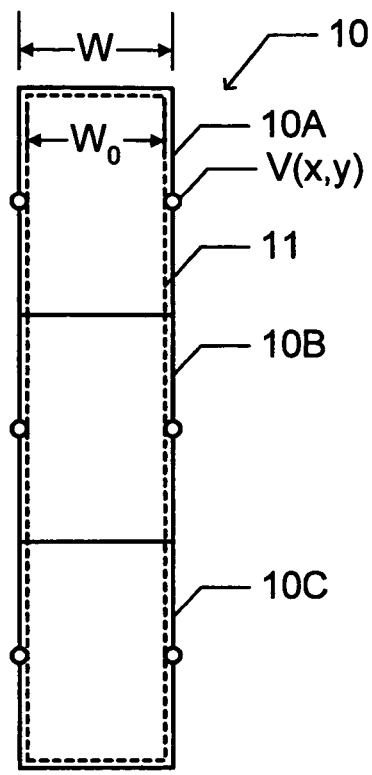
FIG. 11A is a plan view showing exposure patterns, target patterns after development and evaluation points.

FIG. 11A shows an example of an exposure pattern. A target resolution pattern 11 having a width $W_0$ relates to an exposure pattern 10 having a width W. The exposure pattern 10 is divided, for example, into three correction units 10A to 10C. A pattern after development is brought close to a target pattern by shifting the outer peripheral line of the exposure pattern 10 with respect to each correction unit. This shift amount is decided with respect to each side of the correction unit.

Steps SD1 and SD2 shown in FIG. 10 are the same as Steps SB1 and SB2 of the first embodiment. At Step SD3, a shift amount $e_p$ of each side to be corrected of all correction units is initialized. For example, a shift amount is set to 0. At Step SD4, a counter n is initialized. At Step SD5, the counter n is incremented by 1. This process is the same as Steps SB4 and SB5 of the first embodiment shown in FIG. 2.

Steps SD6 and SD7 are executed for all element distributions for the components fb influencing adjacent patterns. At Steps SD6 and SD7, the element distribution $g_k$ is processed where k=Na+n (n is a counter value set at Step SD5).

At Step SD6, a pattern area density map $DM_k$ corresponding to the element distribution $g_k$ is defined by the same method as that of the first embodiment. An area density $\alpha_k$ of each small region $R_k$ of the pattern area density map $DM_k$ is calculated in accordance with the present size of the correction unit. At the counter n=1, all shift amounts $e_p$ are set to 0. At the counter n=2 or larger, the area density $\alpha_k$ is calculated by using the size of the correction unit deformed by the shift amount $e_p$ corrected at a later Step SD9. In the second embodiment, since the standard exposure dose is assigned to all exposure patterns, $d_p$ in the equation (7) of the first embodiment is 1. The average exposure dose $d_k$ is therefore 1.

At Step SD7, smoothing of the area density is performed by the same method as that at Step SB7 of the first embodiment to obtain a corrected area density $\alpha_{sk}$ of the small region $R_k$.

At Step SD8, a deposition energy at the evaluation point is calculated for the component fb influencing adjacent patterns. In the second embodiment, a center point of each side of each of the correction units 10A to 10C shown in FIG. 11A is used as the evaluation point V(x, y). The deposition energy at the evaluation point V(x, y) is calculated by the same method as that at Step SB8 of the first embodiment. Since the evaluation point V(x, y) is generally not coincident with the center point of the standard small region $R_{Na+1}$, an interpolation calculation indicated by the equation (11) is performed.

At Step SD9, a shift amount of each side of each of the correction units 10A to 10C is corrected. In the following, a shift amount correction method will be described. In the second embodiment, since $d_p$ in the equation (13) is 1, the equation (13) can be rewritten as in the following:

$$\epsilon_p(W) + \alpha_s \eta(x, y) = F_{th} \quad (15)$$

In the first embodiment, the width W is fixed and the exposure dose $d_p$ is calculated in the equation (13). Conversely, in the second embodiment, $d_p$ is fixed to 1 and the width W is determined so as to satisfy the equation (15) at each evaluation point V(x, y). The shift amount $e_p$ of each side of each of the correction units 10A to 10C can be calculated from the following equation by using a newly determined W:

$$e_p = \frac{W - W_0}{2} \quad (16)$$

If $e_p > 0$, a side is shifted to broaden the correction units 10A to 10C, whereas if $e_p < 0$, a side is shifted to narrow the correction units 10A to 10C.

Figure 11B:
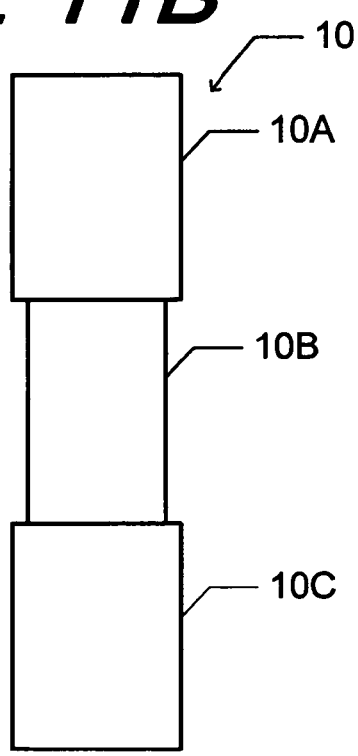
FIG. 11B is a plan view showing an exposure pattern after pattern correction.

FIG. 11B shows an example of an exposure pattern 10 after the shapes of the correction units 10A to 10C are changed. In the example shown in FIG. 11B, the shift amount $e_p$ assigned to the correction units 10A and 10C is positive, and the shift amount $e_p$ assigned to the correction unit 10B is negative.

At step SD10, a difference is calculated, for all correction units, between a newly obtained shift amount $e_p$ and the previous shift amount $e_p$ which is used for calculating the newly obtained shift amount. A maximum difference is compared with an allowable value. If a difference between the shift amounts $e_p$ is equal to, or smaller than, the allowable value, the process is terminated, and the shape of the exposure pattern is corrected by using the newly obtained shift amounts $e_p$. If a difference between the shift amounts $e_p$ is larger than the allowable value, processes from Step SD5 are executed again based on the newly obtained shift amounts $e_p$ and corrected exposure pattern. The number of repetitions of the processes to be executed from Step SD5 may be determined beforehand.

As in the case of the first embodiment, also in the second embodiment, the shape and size of a pattern after development can be brought close to the target shape and size.

Next, the projection method according to the third embodiment will be described. In the first and second embodiments, the EID function in the exposure plane is assumed to be invariable. Specifically, the energy deposition rate $a_k(l, m)$ defined by the equation (9) does not depend upon the position of the target small region $R_k(i, j)$, but depends upon only the distance. As indicated by the equation (8), the corrected area density $\alpha_{sk}(i, j)$ is determined from the energy deposition rate $a_k(l, m)$, area density $\alpha_k(i+l, j+m)$ and average exposure dose $d_k(i+l, j+m)$. Namely, it does not consider the case in which various kinds of materials are distributed on the planes of lower-level layers under the resist film and distribution densities are irregular on the planes.

In an actual semiconductor substrate, a layer disposed below the resist film is not uniform in a substrate in-plane in some cases. For example, if a via layer with distributed tungsten plugs is disposed in a silicon oxide film, a distribution density of tungsten plugs is not uniform on the plane of the substrate. The EID function based on the backscattering varies on the plane of the substrate under the influence of the via layer. More specifically, the energy deposition rate $a_k(i, j)$ defined by the equation (9) varies depending upon the area density of the lower-level tungsten plugs and the area density of the silicon oxide region.

Prior to describing the third embodiment, description will be directed to a method of calculating a corrected area density disclosed in JP-A-2005-101501. This method takes into consideration the case in which various kinds of materials are distributed on the plane of lower-level layers below the resist film and distribution densities are irregular on the plane.

Figure 12:
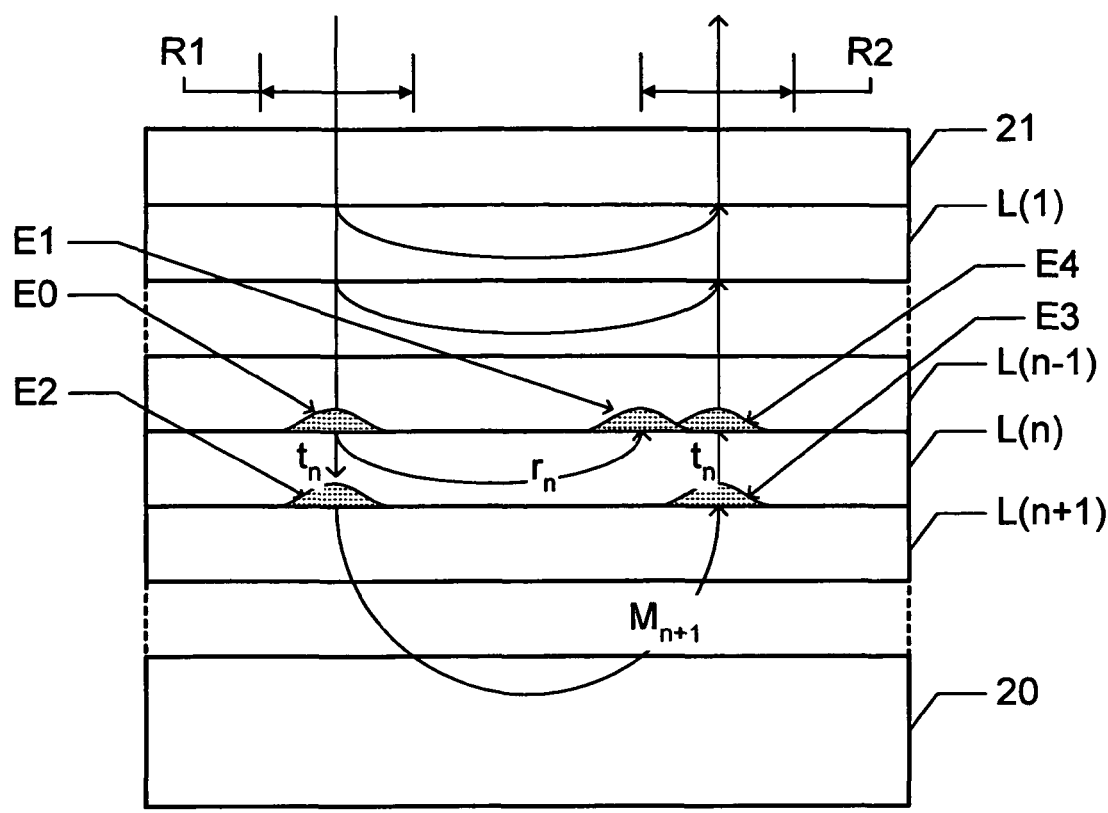
FIG. 12 is a cross sectional view illustrating backscattering when a plurality of layers are disposed under a resist film.

FIG. 12 shows a lamination structure of a substrate for which the corrected area density is calculated. A plurality of layers L are formed on a substrate 20, and a resist film 21 is formed as an uppermost layer. The n-th layer as counted from the resist film 21 is represented by L(n). A pattern area density map is defined on the plane of the substrate as in the case of the first and second embodiments.

A reflection coefficient is represented by rn, corresponding to the number of charged particles transmitted through the layer L(n−1) and reflected by the layer L(n). A transmission coefficient is represented by tn, corresponding to the number of charged particles reached the layer L(n) and transmitted through the layer L(n). The reflection coefficient rn, transmission coefficient tn and a scattering distribution of charged particles in the layer L(n) are given with respect to each material of the layer L(n). The scattering distribution is defined by an energy deposition rate an. An area density an of material of the layer L(n) is given with respect to each small region.

A charged particle energy distribution of charged particles reached the upper surface of the layer L(n) from the upper-level layer is called a first charged particle energy distribution E0.

A portion of charged particles reached the upper surface of the layer L(n) is reflected in the layer L(n) and returns to the upper surface of the layer L(n). A charged particle energy distribution of charged particles returned to the upper surface of the layer L(n) is called a reflected charged particle energy distribution E1. The reflected charged particle energy distribution E1 can be calculated from the first charged particle energy distribution E0, the reflection coefficient rn of the layer L(n), the area density an of the layer L(n) and the energy deposition rate an. This energy deposition rate results from backscattering.

A portion of charged particles reached the upper surface of the layer L(n) transmits through the layer L(n) and reaches the interface between the layers L(n) and L(n+1). A charged particle energy distribution of these charged particles is called a downward transmission charged particle energy distribution E2. The downward transmission charged particles energy distribution E2 can be calculated from th first charged particle energy distribution E0, the transmission coefficient of the layer L(n), the area density an and the energy deposition rate an. This energy deposition rate results from forward-scattering.

A portion of charged particles reached the interface between the layers L(n) and L(n+1) is subjected backscattering in all layers under the layer L(n) including the layers L(n+1), L(n+2), L(n+3), . . . and substrate 20, and returns to the interface between the layers L(n) and L(n+1). The charged particle energy distribution of these charged particles is called a second charged particle energy distribution E3. The second charged particle energy distribution E3 can be calculated from the downward transmission charged particle energy distribution E2 and a charged particle energy coefficient map Mn+1 of the layer L(n+1).

A portion of charged particles returned to the interface between the layers L(n) and L(n+1) transmits through the layer L(n) and reaches the upper surface of the layer L(n). A charged particle energy distribution of these charged particles is called an upward transmission charged particle energy distribution E4. The upward transmission charged particle energy distribution E4 can be calculated from the second charged particle energy distribution E3, the transmission coefficient tn of the layer L(n), the area density an and the energy deposition rate an.

By adding the reflection charged particle energy distribution E1 and upward transmission charged particle energy distribution E4, a charged particle energy distribution of charged particles returned to the upper surface of the layer L(n) from lower-level layers can be obtained. This charged particle energy distribution is called a third charged particle energy distribution.

More specifically, this step can obtain the third charged particle energy distribution E1+E4 of charged particles returned to the upper surface of layer L(n) from lower-level layers, regarding the first charged particle energy distribution E0 of charged particles incident upon the upper surface of the layer L(n) from upper-level layers. By recursively executing this step from the first layer L(1) under the resist film 21 to the lowermost layer, the charged particle energy distribution of charged particles being backscattered and reaching the bottom surface of the resist film 21. This charged particle energy distribution corresponds to the corrected area density $\alpha_{sk}(i, j)$ indicated by the equation (8). It is possible to obtain the deposition energy $\alpha_{sc}(x, y)$ at an arbitrary evaluation point by interpolation calculation indicated in the equation (11).

Next, the projection method by the third embodiment will be described. In the third embodiment, the EID function is separated into three components fa, fb and fc. The component fa is a component not influencing adjacent patterns in the forward-scattering term, and the component fb is a component influencing adjacent patterns in the forward-scattering term. The component fc is backscattering component.

A deposition energy based on the components fa and components fb is calculated by the method of the first and second embodiments. A deposition energy $\alpha_{sc}(x, y)$ based on the components fc is calculated by the method disclosed in JP-A-2005-101501.

By expanding the equation (13) described in the first embodiment to the third embodiment, the following equation is obtained:

$$\{\epsilon_p(W)+\alpha_s\eta(x, y)+\alpha_{sc}(x, y)\}d_p=F_{th} \qquad (17)$$

An exposure dose $d_p$ is determined in such a manner that the equation (17) is satisfied.

By expanding the equation (15) described in the second embodiment to the third embodiment, the following equation is obtained:

$$\epsilon_p(W)+\alpha_s\eta(x, y)+\alpha_{sc}(x, y)=F_{th} \qquad (18)$$

The width W of each correction unit is determined in such a manner that the equation (18) is satisfied.

In the third embodiment, by considering the in-plane distribution of material in each lower-level layer below the resist film 21, the shape and size of a pattern after development can be brought close to the target shape and size.

A proximity effect correction sequence adopted by the projection methods of the first to third embodiments is provided in the form of a computer executable program.

The present invention has been described in connection with the preferred embodiments. The invention is not limited only to the above embodiments. It will be apparent to those skilled in the art that other various modifications, improvements, combinations, and the like can be made.

What I claim is:

1. A charged particle beam projection method comprising:
   (a) preparing pattern data for defining a plurality of patterns which are to be formed in a resist film;
   (b) assigning an exposure dose for exposing the pattern to each of the plurality of patterns;
   (c) approximating a deposition energy distribution when a charged particle beam is made incident upon the resist film, by a sum of a plurality of element distributions, each of which is represented by a Gaussian distribution;
   (d) defining a pattern area density map, partitioning a pattern layout plane on which the resist film is to be formed into a plurality of small regions, with respect to each of at least some element distributions among the plurality of element distributions;
   (e) repeating sub-steps (e1) and (e2) with respect to each of the pattern area density maps,
   (e1) obtaining an area density with respect to each small region, the area density indicating a ratio of an area occupied by the pattern disposed in the small region on the pattern layout plane to a whole area of the small region, for the pattern to be formed in the resist film, and
   (e2) calculating a corrected area density representative of a deposition energy to be given to the target small region when the patterns are exposed at the exposure dose assigned thereto, and assigning the corrected area density calculated to every small region;
   (f) calculating the deposition energy at an evaluation point on the pattern layout plane, from the corrected area density calculated in the sub-step (e2); and
   correcting the exposure dose assigned to the patterns based on the deposition energy calculated, and exposing the resist film to an electron beam based on the pattern data and the exposure dose corrected, and developing the resist film.

2. The charged particle beam projection method according to claim 1, wherein in the step (d), the pattern area density maps are defined in such a manner that size of the small regions is dependent upon a spread of corresponding element distribution.

3. The charged particle beam projection method according to claim 1, wherein in the step (d), the pattern area density maps are defined in such a manner that a ratio between a size of the small region of the pattern area density map and a spread of the element distribution corresponding to the pattern area density map is equal for all pattern area density maps.

4. The charged particle beam projection method according to claim 1, wherein in the sub-step (e1), by using the area density of the small region of the pattern area density map corresponding to a narrowest spread element distribution among the plurality of element distributions defining the pattern area density maps, the area density of each small region of other pattern area density maps is calculated.

5. The charged particle beam projection method according to claim 1, wherein in the step (f), the deposition energy at the evaluation point is calculated by extracting a plurality of center points of the small regions in an order starting from a nearest center point to the evaluation point, and by interpolating the corrected area densities given by the sub-step (e2) of the small regions corresponding to the extracted center points.

6. The charged particle beam projection method according to claim 1, wherein in the step (f), the deposition energy at the evaluation point is calculated by obtaining the deposition energy at the evaluation point with respect to each pattern area density map, and adding the obtained deposition energies through weighting by an influence degree of the element distribution corresponding to each pattern area density map upon the deposition energy distribution.

7. The charged particle beam projection method according to claim 1, wherein after the step (c), the plurality of element distributions are further classified into first components not influencing adjacent patterns and second components influencing adjacent patterns, in the step (d) the pattern area density maps are defined for the element distributions classified into the second components, and in the step (f) the deposition energy at the evaluation point on the pattern layout plane is calculated from the deposition energies for the element distributions classified into the first components and the corrected area density calculated by the sub-step (e2).

8. The charged particle beam projection method according to claim 7, wherein the first components and the second components are components based on forward-scattering, and in the step (c) the deposition energy distribution when the charged particle beam is made incident upon the resist film, is separated into third components based on backscattering, in addition to the first and second components, the charged particle beam projection method further comprises a step of:
   (g) calculating the deposition energy based on backscattering of the third components at the evaluation point, by considering a distribution of materials on a plane of a lower-level layer below the resist film to be exposed,
   wherein in the step (f), the deposition energy at the evaluation point on the pattern layout plane is calculated from the deposition energies for the element distributions classified into the first components, the corrected area density calculated by the sub-step (e2) and the deposition energies for the third components calculated at the step (g).

9. The charged particle beam projection method according to claim 7, further comprising a step of:
   (h) correcting the exposure dose assigned to each pattern in accordance with the deposition energy at the evaluation point calculated by the step (f), in such a manner that a pattern after development has a target size.

10. The charged particle beam projection method according to claim 7, further comprising a step of:
    (i) adjusting a size of the pattern defined by the pattern data in accordance with the deposition energy at the evaluation point calculated by the step (f), in such a manner that a pattern after development has a target size.

11. The charged particle beam projection method according to claim 1, wherein sub-step (e2) repeats (e21) selecting, (e22) repeating and (e23) calculating until all the small regions are selected as the target small region,
    (e21) selecting one small region from among the small regions as the target small region, (e22) repeating (e221) selecting and (e222) calculating until all the small regions influencing the target small region are selected as a first small region,
- (e221) selecting one small region influencing the target small region from the small regions as the first small region;
- (e222) calculating a sub corrected area density for the target small region based on an energy deposition rate representative of an influence degree of a deposition energy at which exposure to the first small region influences the target small region, an exposure dose assigned to a pattern in the first small region, an area of the pattern, and the area density of the first small region;

(e23) calculating a corrected area density for the target small region by adding the sub corrected area densities for the small regions influencing the target small region.

12. A charged particle beam projection method comprising:
- (a) preparing pattern data for defining a plurality of patterns on a pattern layout plane;
- (b) assigning an exposure dose for exposing the pattern to each of the plurality of patterns;
- (c) approximating a deposition energy distribution when a charged particle beam is made incident upon a resist film, by a sum of a plurality of element distributions, each of which is represented by a Gaussian distribution;
- (d) defining a pattern area density map, partitioning the pattern layout plane into a plurality of small regions, with respect to each of at least some element distributions among the plurality of element distributions;
- (e) repeating sub-steps (e1) and (e2) with respect to each of the pattern area density maps,
- (e1) obtaining an area density with respect to each small region, the area density indicating a ratio of an area occupied by a pattern disposed in the small region to a whole area of the small region, and
- (e2) calculating a corrected area density representative of a deposition energy to be given to a target small region when the patterns are exposed at the exposure dose assigned thereto, and assigning the corrected area density calculated to every small region;
- (f) calculating the deposition energy at an evaluation point on the pattern layout plane, from the corrected area density calculated in the sub-step (e2); and correcting the exposure dose assigned to the patterns based on the deposition energy calculated, and exposing a resist film to an electron beam based on the pattern data and the exposure dose corrected, and developing the resist film, wherein in the step (d), the pattern area density maps are defined in such a manner that the small region of the pattern area density map defined for the element distribution having a narrowest spread among a plurality of element distributions defining the pattern area density maps, does not override a border line of the small region in each of other pattern area density maps.

* * * * *